(12) United States Patent
Liu

(10) Patent No.: US 6,211,085 B1
(45) Date of Patent: Apr. 3, 2001

(54) METHOD OF PREPARING CU INTERCONNECT LINES

(75) Inventor: Chung-Shi Liu, Hsin-Chu (TW)

(73) Assignee: Taiwan Semiconductor Company, Hsin-Chu (TW)

(*) Notice: Subject to any disclaimer, the term of this patent is extended or adjusted under 35 U.S.C. 154(b) by 0 days.

(21) Appl. No.: 09/252,491

(22) Filed: Feb. 18, 1999

(51) Int. Cl.[7] .................... H01L 21/4763; H01L 21/44
(52) U.S. Cl. ................... 438/687; 438/624; 438/634; 438/638; 438/639; 438/641; 438/674; 438/675
(58) Field of Search ..................... 438/687, 672, 438/674, 675, 680, 685, 641, 638, 622, 624, 639, 633–634; 257/774

(56) References Cited

U.S. PATENT DOCUMENTS

| | | | |
|---|---|---|---|
| 5,612,254 | 3/1997 | Mu et al. ................. | 437/195 |
| 5,635,423 * | 6/1997 | Huang et al. ............ | 437/195 |
| 5,654,245 | 8/1997 | Allen ....................... | 438/629 |
| 5,744,376 | 4/1998 | Chan et al. .............. | 437/190 |
| 5,770,517 | 6/1998 | Gardner et al. .......... | 438/627 |
| 5,891,513 * | 4/1999 | Dublin et al. ............ | 427/98 |
| 5,897,369 * | 4/1999 | Jun ........................... | 438/629 |
| 5,985,751 * | 11/1999 | Koyama ................... | 438/637 |
| 6,010,962 * | 1/2000 | Liu et al. ................. | 438/687 |
| 6,028,362 * | 2/2000 | Omura ..................... | 257/774 |
| 6,042,999 * | 3/2000 | Lin et al. ................. | 430/316 |

* cited by examiner

Primary Examiner—John F. Niebling
Assistant Examiner—Ha Tran Nguyen
(74) Attorney, Agent, or Firm—George O. Saile; Stephen B. Ackerman

(57) ABSTRACT

A method for forming a Wolfram plug within a dual Damascene structure that can make copper interconnect at the first level metal thereby providing a first level metal copper contact. The method of the present invention eliminates Prior Art problems experienced in forming metal contacts for narrow and deep dual Damascene structures and allows the simultaneous formation of metal contacts for shallow and deep contact holes within dual Damascene structures. At the bottom of the conventional trench and hole of the Damascene structure, a wolfram film is selectively grown on the silicide. Barriers are formed on top of the wolfram and on the uncovered sides of the hole after which copper is deposited in the remainder of the hole. The top surface of the structure obtained in this manner is planarized using copper CVD technology.

24 Claims, 4 Drawing Sheets

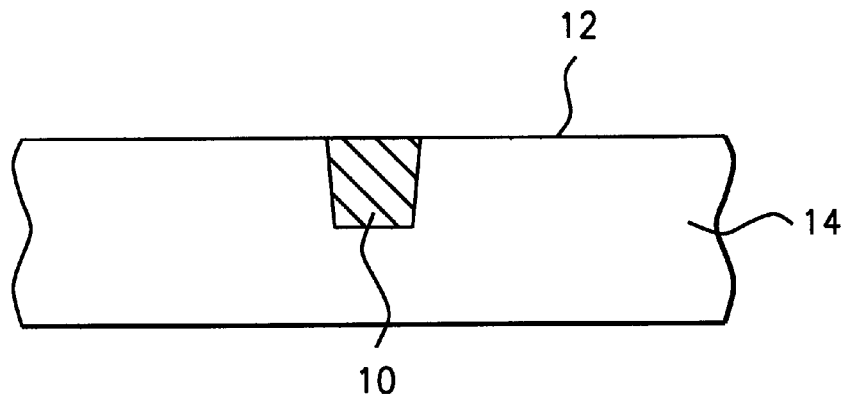
FIG. 1a – Prior Art
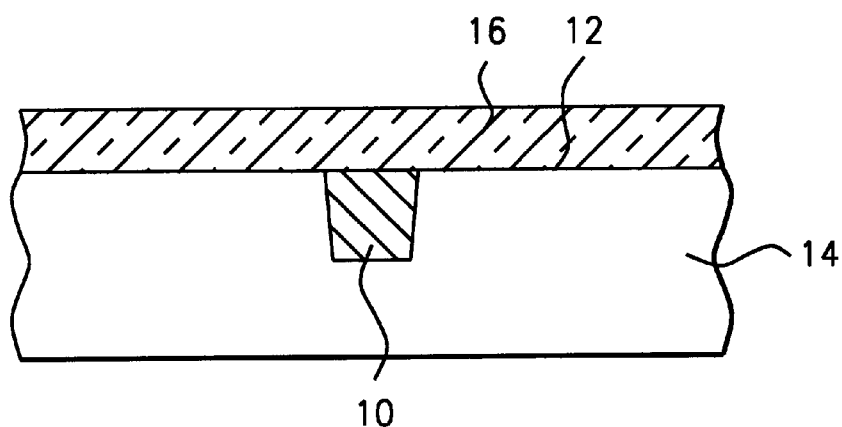
FIG. 1b – Prior Art
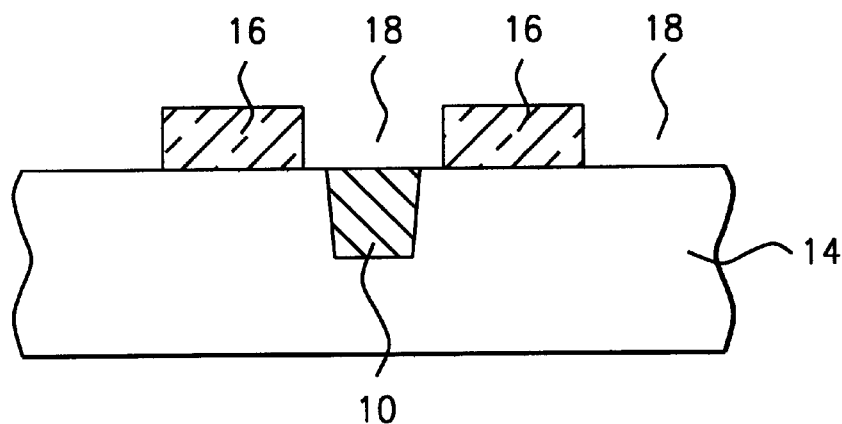
FIG. 1c – Prior Art

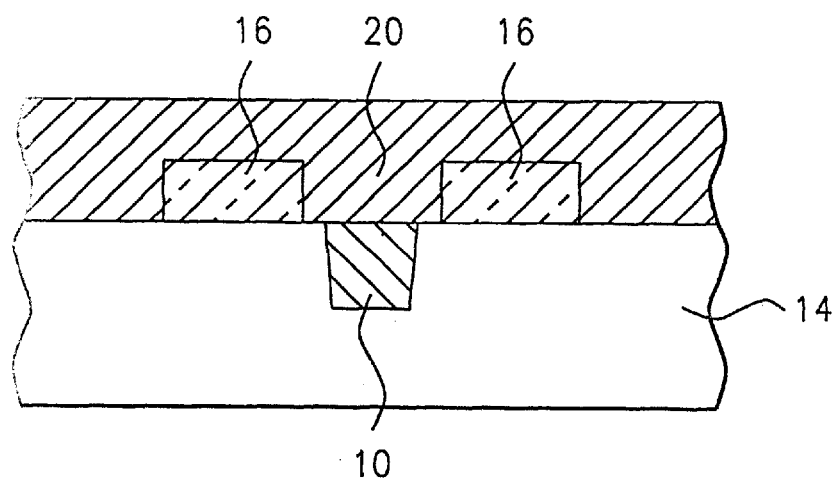
FIG. 1d – Prior Art
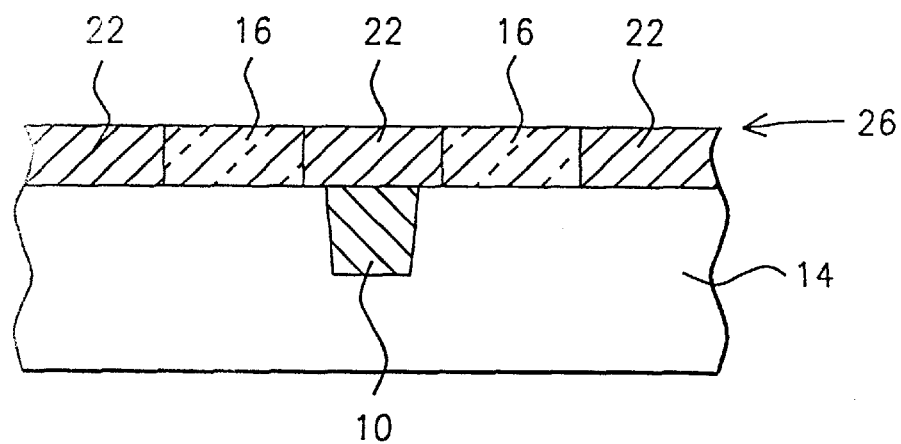
FIG. 1e – Prior Art

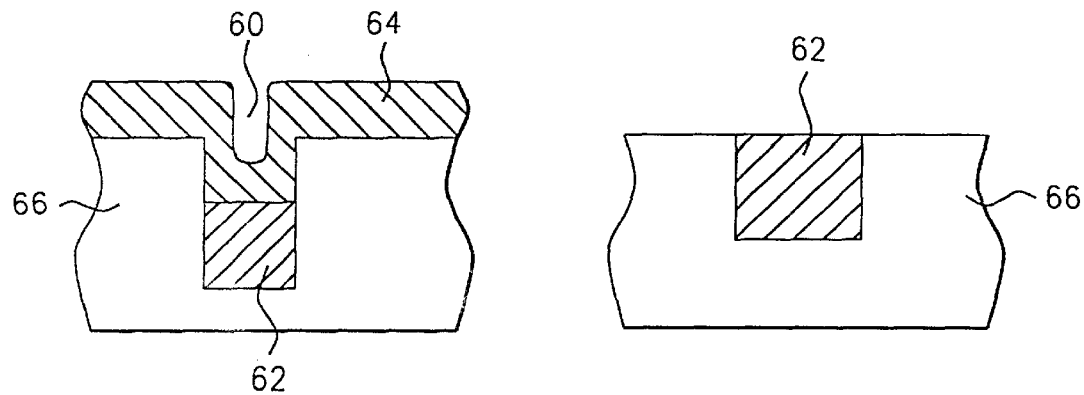
FIG. 2a – Prior Art  FIG. 2b – Prior Art
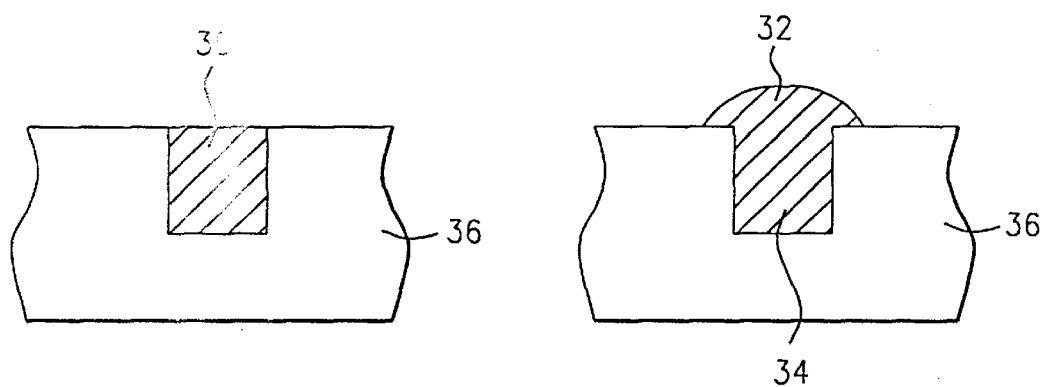
FIG. 3a – Prior Art  FIG. 3b – Prior Art

METHOD OF PREPARING CU INTERCONNECT LINES

BACKGROUND OF THE INVENTION (1). Field of the Invention.

The present invention relates to the field of semiconductor manufacturing, and more specifically to the formation of contact holes for a dual Damascene structure.

(2). Description of the Prior Art.

The present invention relates specifically to the Damascene process that is used for the formation of semiconductor devices. Damascene derives its name from the ancient art involving inlaying metal in ceramic or wood for decorative purposes. In Very Large-Scale Integrated circuit applications, the Damascene process refers to a similar structure.

The Damascene process has been demonstrated on a number of applications. The most commonly applied process is first metal or local interconnects. Some early Damascene structures have been achieved using Reactive Ion Etching (RIE) but Chemical Mechanical Planarization (CMP) is used exclusively today. Metal interconnects using Damascene of copper and of aluminum is also being explored.

FIG. 1a gives an overview of the steps of the Damascene process, as follows:

Step 1 shows the formation of the metal plug, step 2 shows the deposition of the Inter Level Dielectric, step 3 shows the formation of the trenches for metal lines, step 4 shows the deposition of metal to fill the trenches, step 5 shows the removal of metal from the surface.

The Damascene process is further explained below, the numbers indicated within this explanation refer to the cross section of a Damascene structure that is shown in FIG.1b.

Referring now specifically to FIG. 1a there is shown the formation of a metal via plug 10 within the semi-conductor substrate 14 (FIG. 1e). Any micro-scratch present on the surface will fill with metal during subsequent metal deposition and can cause electrical shorts between adjacent via plugs 10 or between electrical lines deposited on top of surface 12. To remove the Damascene residue and to remove the scratch count on the surface 12, surface 12 is polished and buffed after the metal plugs 10 have been deposited.

FIG. 1b shows the deposition of the Intra-Level Dielectric (ILD) 16 (FIG. 1b) which can be deposited using Plasma Enhanced CVD (PECVD) technology. Dielectric 16 can, for instance, be $SiO_2$.

FIG. 1c shows the formation of the trenches 18 for the metal lines, these trenches 18 can be formed using Reactive Ion Etching (RIE) technology.

FIG. 1d shows the deposition of metal 20 to fill the trenches, this process can use either the CVD or a metal flow process. The excess metal on the surface is removed using the CMP process, see FIG. 1e and a planar structure 26 with metal inlays 22 in the intra-level dielectric 16 is achieved.

The application of the Damascene process continues to gain wider acceptance, most notably in the process of copper metalization due to the difficulty of copper dry etch where the Damascene plug penetrates deep in very small, sub-half micron, Ultra Large Scale integrated devices. Recent applications have successfully used copper as a conducting metal line, most notably in the construct of CMOS 6-layer copper metal devices. Even for these applications however, the wolfram plug was still used for contact points in order to avoid damage to the devices.

FIG. 2a shows Prior Art problems encountered when filling a Damascene Wolfram plug 62 with aluminum 64. The plug 62 can be formed in poly silicide 66. A void 60 can develop above the opening of a Damascene plug 62 if the opening is relatively narrow and deep, a design characteristic that becomes more common with smaller semiconductor devices. This void 60 is caused by the difficulty experienced in having deep penetrating flow of the Al within the narrow opening. For a shallow or relatively wide plug 62, FIG. 2b, these problems are not experienced. Void 60 (FIG. 2a) also causes planarization problems during subsequent processing steps and can create a reliability issue.

FIG. 3 shows a Prior Art blanket deposition of metal within the hole 30. This hole 30 can exists in a semiconductor substrate 36. Where the hole 30 is relatively shallow and wide, no problems of deposition are experienced, see FIG. 3a. This blanket deposition requires polish back, in the absence of polish back problems of shorts between metal lines arises caused by remaining metal on top of the surface. FIG. 3b demonstrates another Prior Art approach where the top 32 of the plug 34 is further extended by overfill. The extension 32 can be obtained by depositing a layer of wolfram across the surface and applying an etchback to that layer such that wolfram is left in place around the top of the plug.

An extension of the damascene process is the dual damascene process whereby an insulating or dielectric material, such as silicon oxide, is patterned with several thousand openings for the conductive lines and vias, which are filled at the same time with metal. Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed. One of the dual damascene approaches uses a dielectric layer that is formed by three consecutive depositions whereby the central layer functions as an etch stop layer. This etch stop layer can be SiN, the top and bottom layer of this three layer configuration can be $SiO_2$. This triple layer dielectric allows first forming the vias by resist patterning the vias and etching through the three layers of dielectric. The conductive pattern can then be formed in the top layer of dielectric whereby the central layer of SiN forms the stop layer for the etch of the conducting pattern. Another approach, still using the three-layer dielectric formed on the substrate surface, is to first form the pattern for the conducting lines in the top layer of the dielectric whereby the SIN layer again serves as etch stop. The vias can then be formed by aligning the via pattern with the pattern of the conducting lines and patterning and etching the vias through the etch stop layer of SiN and the first layer of dielectric. Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited; the conducting lines are now patterned and etched. The SiN layer will stop the etching except where the via openings have already been etched.

Yet another approach to forming the dual damascene structure is to form an insulating layer that is coated with a photoresist. The photoresist is exposed through a first mask with image pattern of the via openings, this via pattern is anisotropically etched in the upper half of the insulating layer. The photoresist now is exposed through a second mask with an image pattern of the conductive line. The pattern of the conducting lines is aligned with the pattern of the vias thereby encompassing the via openings. In anisotropically etching the openings for the conductive lines in the upper half of the insulating material, the via openings already present in the upper half are simultaneously etched and replicated in the lower half of the insulating material.

Dual damascene is an improvement over single damascene because it permits the filling of both the conductive grooves and vias with metal at the same time, thereby eliminating process steps.

In short, Prior Art experiences problems in creating a plug for the Damascene process that provides a reliable connect. In filling deep or narrow holes, problems of aluminum voids can arise. This in turn causes problems with planarization of subsequent layers that are deposited over the Damascene plug since these layers may now be deposited on a surface of poor planarity.

In overfilling a shallow hole, a polish-back is required in order to avoid shorts by leftover materials between metal lines. Polish-back further complicates the process and adds to the expense incurred while in many instances polishing has to be done in combination with buffing in order to obtain acceptable planarization.

U.S. Pat. No. 5,564,245 (Allen) shows a Cu interconnect over a W plug with a barrier layer therebetween.

U.S. Pat. No. 5,744,376 (Chan et al.) discloses a Cu interconnect formed using V*IN barrier layer and Damascene process.

U.S. Pat. No. 5,770,517 (Gardner et al.) shows Cu interconnect formed using another barrier layer and Damascene process.

U.S. Pat. No. 5,612,254 (Mu et al.) shows a dual Damascene structure using Cu and a barrier layer. However, this reference differs from the present invention.

SUMMARY OF THE INVENTION

A principal objective of the present invention is a method for formation of a W-plug that can make copper interconnect at the first level metal.

Another objective of the present invention is to reduce the number of processing steps required for the formation of a W-plug that can make copper interconnect at the first level metal.

Yet another objective of the present invention is to reduce the cost of the formation of the W-plug that can make copper interconnect at the first level metal.

Yet another objective of the present invention is to eliminate the need for selective Wolfram Chemical Vapor Deposition (WCVD) at the contact level in order to match the simultaneous formation of shallow and deep plugs.

Yet another objective of the present invention is to eliminate the need for post CMP cleaning.

As a first step, the conventional trench and hole of the Damascene structure are formed. Silicide is at the bottom of the hole; a wolfram film is selectively grown on the silicide by selective WCVD at the contact hole of the Damascene structure. Barriers are formed on top of the wolfram and on the uncovered sides of the hole after which copper is deposited in the remainder of the hole. The top surface of the structure obtained in this manner is planarized using copper CVD technology.

BRIEF DESCRIPTION OF THE DRAWINGS

FIGS. 1a through FIG. 1e show a Prior Art overview of the Damascene process.

FIGS. 2a and 2b show a Prior Art plug formation process of narrow/deep holes.

FIG. 3a and 3b show a Prior Art plug formation process of shallow/wide holes.

DETAILED DESCRIPTION OF THE PREFERRED EMBODIMENT

The present invention addresses the case where a contact via is used and electrical contact is established by means of a wolfram Damascene plug. One of the most difficult problems in metalization is to assure that enough metal continuity is provided at contact windows and vias. The step coverage of sputtered Al decreases rapidly with increasing contact window aspect ratio and at small design rules the step coverage and vias drop below 20%. No metal reliability can be guaranteed at this level of step coverage, and, as a consequence, various forms of metal plugs have been developed.

On a silicon contact, the selective process starts from a silicon reduction process. This process provides a nucleation layer of Wolfram (W) grown on Si but not on $SiO_2$. A hydrogen reduction process grows the real W plug. This process deposits W rapidly on the nucleation layer thus forming the plug. This process however does not have perfect selectivity and, as a result, spurious nucleation and W growth can occur on the $SiO_2$.

Another factor that is unfavorable to a selective W plug is the difficulty in filling contact windows of different heights. This makes selective W suitable only for via contacts.

The present invention addresses the indicated problems of the use of copper in the formation of Damascene plugs by teaching a method of selectively growing a wolfram film on top of the silicide in the contact hole of a dual Damascene structure. Barriers are formed on the bottom and sides of the remaining holes; a copper seed layer is deposited over the barriers. The balance of the hole is filled with copper after which the top surface is planarized for the completion of a copper interconnects at the first metal layer.

Figure 4:
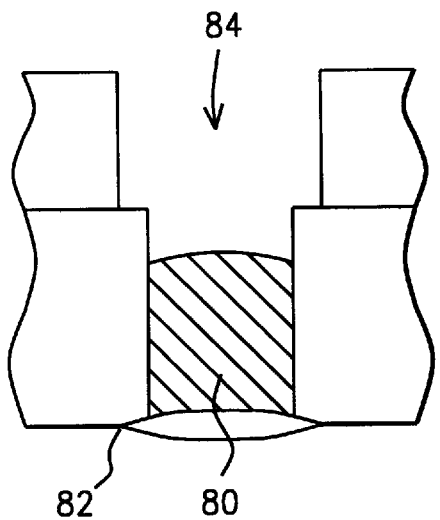
FIG. 4 shows selective WCVD.

FIG. 4 shows a cross section of a dual Damascene structure wherein a metal 80, in this instance wolfram, has been deposited. The bottom 82 of the hole 84 of the dual Damascene structure consists of silicide, as previously indicated, as a leftover of the process of removing the poly-silicon from the hole. The wolfram film 80 is selectively grown on the silicide 82 by selective WCVD at the contact hole 84.

Figure 5:
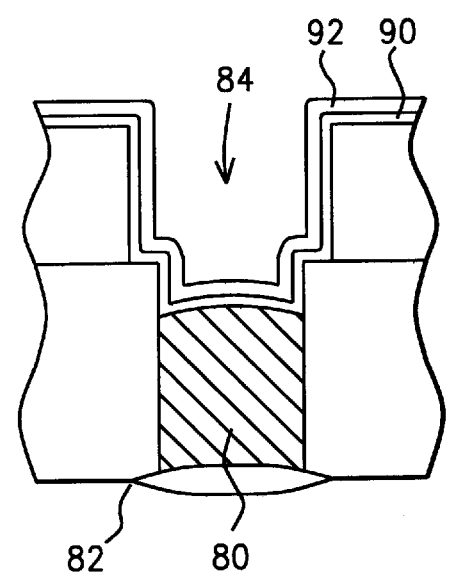
FIG. 5 shows the creation of a barrier and a copper seed layer.

FIG. 5 shows the formation of a barrier 90, a copper seed layer 92 has been deposited on top of barrier 90. The barrier can contain Ta, TaN or TiN. The deposition methods used for both the barrier 90 and the copper seed 92 are by Physical Vapor Deposition (PVD) or Chemical Vapor Deposition (CVD) methods.

Figure 6:
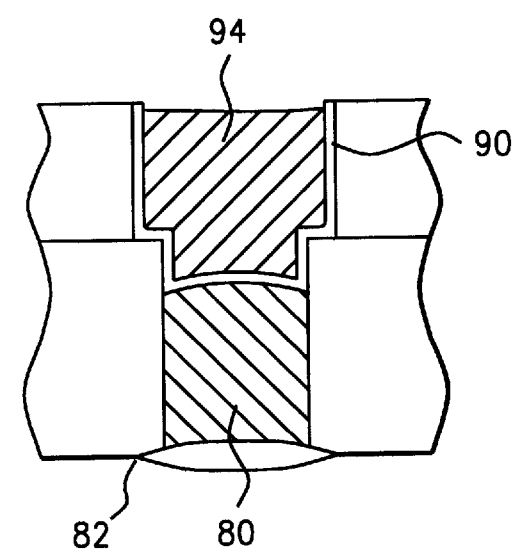
FIG. 6 shows the cross section of the completed dual Damascene structure after copper electro-chemical deposition (ECD) and copper CMP.

FIG. 6 shows the cross section of the completed dual Damascene structure after the opening 84 (FIG. 6) has been filled with, in this instance, copper 94 by electroplating and the copper surface has been planarized.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a dual Damascene copper interconnect within a semiconductor device, comprising the steps of:

provim a semiconductor substrate;

depositing a first layer of dielectric on the surface of said semiconductor substrate, said first layer of dielectric forming an inter-level dielectric layer, said first layer comprising $SiO_2$;

depositing a Plasma Enhanced Chemical Vapor Deposition (PE-CVD) layer of SiN on the surface of said first layer of dielectric;

depositing a second layer of dielectric on the surface of said layer of SiN;

forming a via pattern in said first layer of dielectric by patterning and etching through said second layer of dielectric, etching through said layer of SiN, and etching through said first layer of dielectric; and forming a conducting line pattern by patterning and etching said second layer of dielectric, using said layer of SiN as etch stop layer;

depositing a layer of metal within said dual Damascene structure;

depositing a barrier within said dual Damascene structure;

depositing a copper seed barrier within said dual Damascene structure;

depositing copper within said dual Damascene structure; and planarizing said copper.

2. The method of claim 1 wherein said pattern in said second layer of dielectric overlays said via pattern, dimensions in a plane of deposition of each pattern of said pattern in said second layer of dielectric exceeds dimensions in a plane of deposition of each of said via pattern in said first layer of dielectric by a measurable amount.

3. The method of claim 1 wherein said layer of metal comprises Wolfram.

4. The method of claim 1 wherein said layer of metal comprises a metal other than Wolfram.

5. The method of claim 1 wherein said barrier comprises tantalum or any of its derivatives.

6. The method of claim 1 wherein said barrier comprises titanium or any of its derivatives.

7. The method of claim 1 wherein said barrier deposition applies Physical Vapor Deposition (PVD) technology.

8. The method of claim 1 wherein said barrier deposition applies Chemical Vapor Deposition (CVD) technology.

9. The method of claim 1 wherein a base layer has been created on the top surface of said substrate.

10. The method of claim 1 wherein said wolfram deposition applies selective WCVD at the contact holes of the dual Damascene structure.

11. The method of claim 1 wherein said barrier is grown in-situ or ex-situ.

12. The method of claim 1 wherein said copper deposition uses electroplating deposition technology.

13. The method of claim 1 wherein said copper deposition uses high temperature CVD or PVD deposition technology.

14. A method for forming a dual Damascene copper interconnect within a semiconductor device, said dual Damascene copper interconnect comprising a lower or via pattern and an upper or conducting line pattern, comprising the steps of:

providing a semiconductor substrate;

depositing a base layer on the surface of said semiconductor substrate;

depositing a first layer of dielectric on top of said base layer, said first layer of dielectric to form an inter-level dielectric layer, said first layer of dielectric comprising $SiO_2$;

depositing a PE-CVD layer of SiN on top of said first layer of dielectric;

depositing a second layer of dielectric on top of said layer of SiN;

forming a via pattern in said first layer of dielectric by patterning and etching through said second layer of dielectric, etching through said layer of SiN, etching through said first layer of dielectric, forming the via pattern of said dual Damascene copper interconnect;

forming a conducting line pattern by patterning and etching said second layer of dielectric, using said layer of SiN as etch stop layer, forming said conducting line pattern of said dual Damascene copper interconnect, completing formation of a hole for said dual Damascene copper interconnect, said hole comprising a lower or via pattern and an upper or conducting line pattern;

depositing a film of metal on the bottom of and partially filling said via pattern of said dual Damascene copper interconnect;

depositing a barrier layer within said dual Damascene hole, said barrier layer penetrating said dual Damascene hole, covering the surface of said;

depositing a layer of copper over said barrier layer;

depositing copper within said dual Damascene hole, said deposition fully filling said Damascene hole; and planarizing said copper.

15. The method of claim 14, said first and second layers of dielectric comprising any non-metallic elements used in manufacturing of semiconductor devices.

16. The method of claim 14 wherein said base layer is present at any level within the structure of a semiconductor device.

17. The method of claim 14 wherein said film of metal comprises wolfram.

18. The method of claim 14 wherein said film of metal comprises a metal other than wolfram.

19. The method of claim 14 wherein said barrier deposition uses PVD technology.

20. The method of claim 14 wherein said barrier deposition uses CVD technology.

21. The method of claim 14 wherein said barrier comprises tantalum or any of its derivatives.

22. The method of claim 14 wherein said barrier comprises titanium or any of its derivatives.

23. The method of claim 14 wherein said pattern in said second layer of dielectric overlays said via pattern, dimensions in a plane of deposition of each pattern of said pattern in said second layer of dielectric exceeding dimensions in a plane of deposition of each of said via pattern in said first layer of dielectric by a measurable amount.

24. The method of claim 14 wherein depositing a film of metal uses selective WCVD technology at the contact hole of the dual Damascene structure.

* * * * *